United States Patent
De Santi

(10) Patent No.: US 11,888,433 B2
(45) Date of Patent: Jan. 30, 2024

(54) APPARATUS FOR ALIGNING A SOLAR CELL ELEMENT, SYSTEM FOR USE IN THE MANUFACTURE OF A SOLAR CELL ARRANGEMENT, AND METHOD

(71) Applicant: APPLIED MATERIALS ITALIA S.R.L., San Biagio di Callalta (IT)

(72) Inventor: Luigi De Santi, Spresiano (IT)

(73) Assignee: APPLIED MATERIALS ITALIA S.R.L., San Biagio di Callalta (IT)

( * ) Notice: Subject to any disclaimer, the term of this patent is extended or adjusted under 35 U.S.C. 154(b) by 853 days.

(21) Appl. No.: 16/963,071

(22) PCT Filed: Jan. 18, 2018

(86) PCT No.: PCT/EP2018/051205
§ 371 (c)(1),
(2) Date: Jul. 17, 2020

(87) PCT Pub. No.: WO2019/141362
PCT Pub. Date: Jul. 25, 2019

(65) Prior Publication Data
US 2020/0350852 A1    Nov. 5, 2020

(51) Int. Cl.
*H01L 21/00* (2006.01)
*H02S 20/25* (2014.01)
*H01L 21/68* (2006.01)

(52) U.S. Cl.
CPC .............. *H02S 20/25* (2014.12); *H01L 21/68* (2013.01)

(58) Field of Classification Search
CPC ................................. H02S 20/25; H01L 21/68
See application file for complete search history.

(56) References Cited

U.S. PATENT DOCUMENTS 8,061,500 B2 * 11/2011 Baccini ................. H01L 21/681
  198/346.2
10,991,844 B2 * 4/2021 Gislon ................. B25J 15/0658
(Continued)

FOREIGN PATENT DOCUMENTS

CN     102394226 A    3/2012
EP       2439782 A1   4/2012
(Continued)

OTHER PUBLICATIONS

International Search Report and Written Opinion, PCT/EP2018/051205, dated Nov. 6, 2018.
(Continued)

*Primary Examiner* — Richard A Booth
(74) *Attorney, Agent, or Firm* — Patterson + Sheridan, LLP

(57) ABSTRACT

The present disclosure provides an apparatus (100) for aligning a solar cell element (10). The apparatus (100) includes a transfer device (110) configured for moving the solar cell element (10) from a first position on a carrying device (140) to a second position on a support device, a first detection device (120) configured to detect information about a first position of the solar cell element on the carrying device, and a second detection device (126) configured to detect information about an intermediate position of the solar cell element in relation to the transfer device (110), the transfer device being configured to adjust the orientation of the transfer device based on the information about the first position.

22 Claims, 5 Drawing Sheets

(56) References Cited

U.S. PATENT DOCUMENTS

| | | | |
|---|---|---|---|
| 11,637,212 B2 * | 4/2023 | Galiazzo | ............ H01L 31/0504 |
| | | | 136/244 |
| 2009/0202727 A1 | 8/2009 | Abas et al. | |
| 2013/0272833 A1 | 10/2013 | Duncan et al. | |
| 2017/0032380 A1 | 11/2017 | Gislon et al. | |
| 2017/0323808 A1 | 11/2017 | Gislon et al. | |

FOREIGN PATENT DOCUMENTS

| | | |
|---|---|---|
| KR | 20100134498 A | 12/2010 |
| KR | 20160033992 A | 3/2016 |
| WO | 2009/149211 A2 | 12/2009 |
| WO | 2017/190801 A1 | 11/2017 |

OTHER PUBLICATIONS

Office Action in CN application No. 201820081801.9, dated Aug. 27, 2018.
Chinese National Intellectual Property Administration Office Action dated Feb. 23, 2023.

\* cited by examiner

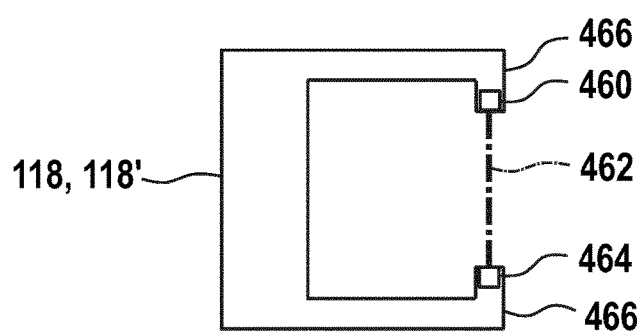
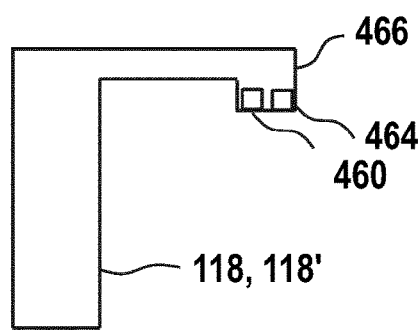
Fig. 4A     Fig. 4B
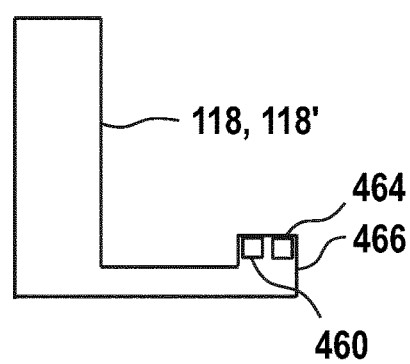
Fig. 4C

APPARATUS FOR ALIGNING A SOLAR CELL ELEMENT, SYSTEM FOR USE IN THE MANUFACTURE OF A SOLAR CELL ARRANGEMENT, AND METHOD

FIELD

Embodiments of the present disclosure relate to an apparatus for aligning a solar cell element, a system for use in the manufacture of a solar cell arrangement, and a method for aligning a solar cell element. Embodiments of the present disclosure particularly relate to an apparatus, system and method for aligning solar cell elements used in the manufacture of shingled solar cells.

BACKGROUND

Solar cells are photovoltaic devices that convert sunlight directly into electrical power. Within this field, it is known to produce solar cell modules as a series of solar cell elements. In order to provide high-quality solar cell modules, the individual solar cell elements of the solar cell module should be assembled in a correct and aligned manner. Since individual solar cell elements can be lightweight, an accurate assembly can be challenging. Further, one of the key factors for the manufacture is the through-put of solar cell production lines where the slowest process action typically governs the maximum throughput. Each increase in through-put is therefore highly beneficial.

In view of the above, new apparatuses and methods for aligning solar cell elements and systems for use in the manufacture of solar cell arrangements that overcome at least some of the problems in the art are beneficial. The present disclosure particularly aims at providing an improved alignment of solar cell elements used in the manufacture of solar cell modules and/or shingled solar cells.

SUMMARY

In light of the above, an apparatus for aligning a solar cell element, a method for aligning a solar cell element and a system for use in the manufacture of a solar cell are provided. Further aspects, benefits, and features of the present disclosure are apparent from the claims, the description, and the accompanying drawings.

According to an aspect of the present disclosure, an apparatus for aligning a solar cell element is provided. The apparatus includes a transfer device configured for moving the solar cell element from a first position on a carrying device to a second position on a support device, a first detection device configured to detect information about a first position of the solar cell element on the carrying device; and a second detection device configured to detect information about an intermediate position of the solar cell element in relation to the transfer device, the transfer device being configured to adjust the orientation of the transfer device based on the information about the first position.

According to an aspect of the present disclosure, an apparatus for aligning a solar cell element is provided. The apparatus includes a first detection device, a transfer device positioned downstream of the first detection device, a second detection device positioned downstream of the first detection device, a first data connection between the first detection device and the transfer device; and a second data connection between the second detection device and the transfer device.

According to an aspect of the present disclosure, a method for aligning a solar cell element is provided. The method includes detecting information about a first position of the solar cell element on a carrying device, adjusting an orientation of the transfer device based on the information about the first position, and detecting information about an intermediate position of the solar cell element in relation to a transfer device.

According to an aspect of the present disclosure, a system for use in the manufacture of an assembled solar cell is provided. The system includes the apparatus for aligning a solar cell element according to the embodiments described herein, an adhesive applying device, and a separation device including a laser scribing unit for preparing a solar cell to provide at least one solar cell element.

Embodiments are also directed at apparatuses for carrying out the disclosed methods and include apparatus parts for performing each described method aspect. These method aspects may be performed by way of hardware components, a computer programmed by appropriate software, by any combination of the two or in any other manner. Furthermore, embodiments according to the disclosure are also directed at methods for operating the described apparatus. The methods for operating the described apparatus include method aspects for carrying out every function of the apparatus.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following:

FIGS. 4A, B and C show cross-sectional views of a first detection device according to embodiments described herein;

DETAILED DESCRIPTION OF EMBODIMENTS

Figure 1A:
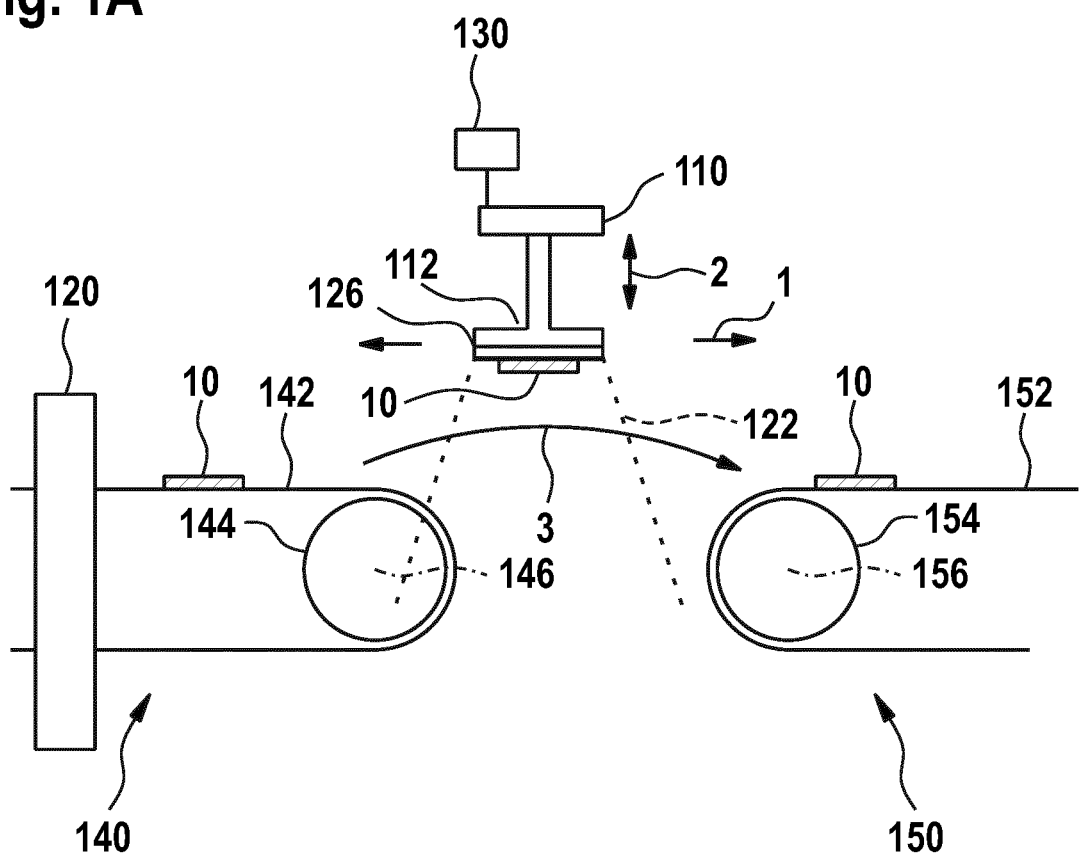
FIG. 1A shows a schematic side view of an apparatus for aligning a solar cell element according to embodiments described herein.

Reference will now be made in detail to the various embodiments of the disclosure, one or more examples of which are illustrated in the figures. Within the following description of the drawings, the same reference numbers refer to same components. Generally, only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

Solar cell modules can include one or more solar cell arrangements made of a series of solar cell elements, such as (full) solar cells or solar cell pieces. In order to provide solar cell modules having improved characteristics, such as an increased module power, the individual solar cell elements of the solar cell module should be assembled in an accurate manner.

The present disclosure may be understood as using information about a first position of a solar cell element on a carrying device for a transfer device to be (pre)-aligned with respect to the solar cell element. The detection device detecting the information about the first position may be different from a second detection device detecting an information about an intermediate position. The solar cell element may then be picked up by the carrying device, information about an intermediate position of the solar cell element in relation to the transfer device may be detected, and the solar cell element may be (fine)-aligned based on the information about the intermediate position.

Further, it may be understood that the transfer device may be (pre)-aligned while the transfer device is still moving (a so called "on-the-fly alignment"). So far, only one detection device has been used for obtaining information about the orientation of a solar cell element on a carrying device. However, one detection device is limited in terms of speed and time.

This form of (pre)-alignment possesses a more time efficient transfer of solar cell elements while maintaining a high quality of the solar cell element and the transfer process. Thus, the transfer and the assembly of the solar cell elements is improved in that it is fast and much more economic.

Another advantage of the apparatus is that a high precision alignment may be performed. Thus, the alignment of solar cell elements or shingles can be very fast and accurate.

The present disclosure may be understood as using a double-detection of an orientation of a solar cell element to improve an alignment of a transfer device and/or the solar cell element, for example, in a process of assembling a solar cell arrangement used in a solar cell module.

In particular, the orientation of the solar cell element on a carrying device is detected by a first detection device, the solar cell element is put on a support device, for example, to assemble the solar cell arrangement, wherein during the process of transferring the solar cell element to the support device information about an intermediate position of the solar cell element is detected by a second detection device in order to improve the transfer process. Specifically, the solar cell element can be brought into a predetermined orientation before the solar cell element is put on the support device.

Figure 1B:
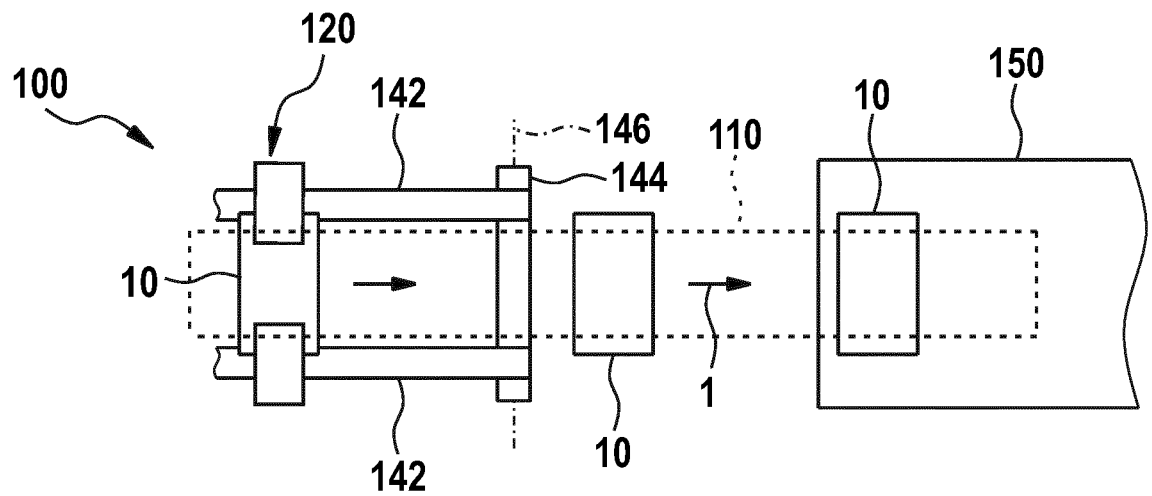
FIG. 1B shows a schematic top view of the apparatus of FIG. 1A with the transfer device having been omitted.

FIG. 1A shows a schematic side view of an apparatus 100 for aligning a solar cell element 10 according to embodiments described herein. FIG. 1B shows a schematic top view of the apparatus 100 of FIG. 1A.

The apparatus 100 includes a transfer device 110 configured for moving the solar cell element 10 from a first position on a carrying device 140 to a second position on a support device 150 (indicated with reference numeral 3). A first detection device 120 is configured to detect information about a first position of the solar cell element 10 on the carrying device 140. A second detection device 126 is configured to detect information about an intermediate position of the solar cell element 10 in relation to the transfer device 110. The transfer device is configured to adjust an orientation of the transfer device and/or the solar cell element 10 based on the information about the first and/or intermediate position of the solar cell element.

A controller 130 may be configured to act on the transfer device based on the information about the first position. Additionally or alternatively, the controller may be configured to act on the transfer device based on the information about the intermediate position. Additionally or alternatively, the controller may be configured to act on the transfer device based on the information about the first and the intermediate positions.

The apparatus 100 can align the orientation of the solar cell element 10 using the first detection device 120 and transfer device 110 such that the solar cell element 10 can be put on the support device 150 with a predetermined orientation. The term "orientation" as used throughout the present disclosure is to be understood in the sense of an orientation or alignment of the solar cell element in a two-dimensional and/or three-dimensional space. For example, the orientation of the solar cell element can be defined using Cartesian coordinates.

In embodiments that can be combined with other embodiments described herein, the apparatus 100 can be configured to determine the information about the first position and then orient a transfer device 110. The determination of the information about the first position of the solar cell element can be performed by a first detection device 120. The first detection device may be placed at the side of the carrying device 140, in particular two sections of the first detection device may be placed at the side of the carrying device, each section being at two opposite sides of the carrying device.

The orientation of the solar cell element may be analyzed by detection of the solar cell element at two detection sections 118, 118' of the first detection device 120 placed opposite to each other. The term "opposite" or "opposite to each other" as used herein, may be understood as the detection sections 118, 118' being arranged at different sides of the carrying device 140. Further, the detection sections may face each other. For example, the detection sections are arranged on different sites of a conveyor belt. In other words, the detection sections 118, 118' may be placed at different sides of the carrying device. The transfer device may then be (pre)-adjusted accordingly.

According to embodiments, the first detection device (120) may detect the information about the first position of the solar cell element (10) during movement of at least one device selected from the group consisting of the carrying device and the transfer device (110).

According to an aspect of the disclosure, the apparatus 100 can be configured to determine information about the intermediate position and then orient the transfer device 110. The information about the intermediate position is determined by a second detection device. The second detection device may analyze the orientation of the solar cell element during transfer of the solar cell element by the transfer device. The orientation of the transfer device may be adjusted to the orientation of the solar cell element to improve the orientation of the solar cell element.

The orientation of the solar cell element can be dependent on the orientation of solar cell elements that are located on the support device in an assembled manner. In other words, the transfer device 110 may be pre-aligned according to the information about the first position and the transfer device 110 may be fine-aligned according to the information about the intermediate position.

As used herein, the terms "pre-aligned" or "pre-alignment" are to be understood as an alignment of the orientation of the transfer device and/or the solar cell element according to the information about the first position obtained by the first detection device. The orientation of the transfer device and/or the solar cell element may be adjusted prior to movement of the transfer device towards the solar cell element to be transferred and/or movement of the solar cell element. The pre-alignment may in particular take place during movement of the gripper, for example during the time period when the transfer device is moved back after transfer of the previous solar cell element to the support device.

As used herein, the terms "fine-aligned" or "fine-alignment" are to be understood as an alignment of the orientation of the transfer device and/or the solar cell element according to the information about the intermediate position obtained by the second detection device. For example, the orientation of the transfer device and/or the solar cell element may be adjusted after the pre-alignment and during movement of the transfer device towards the solar cell element to be transferred. The fine-alignment may in particular take place during movement of the gripper i.e. during the time period when the solar cell element is transferred by the transfer device towards the support device e.g. for assembly of the solar cell element.

In some embodiments which can be combined with other embodiments described, the apparatus 100 can be configured to determine the information about the intermediate position based on edges or corners of the solar cell element 10 detected by the second detection device 126. As an example, a center of the solar cell element 10 can be calculated using the detected edges or corners of the solar cell element 10 by the second detection device. In other words, two directions of the position of the solar cell element may be used to calculate the center of the solar cell element. Additionally, a third direction, e.g. a Θ-direction, may be used for calculating the spatial orientation of the solar cell element. The calculated center and the Θ-direction can then be used to fine-align the solar cell element in relation to the transfer device 110.

According to some embodiments, which can be combined with other embodiments described herein, the transfer device 110 includes a gripper 112 configured to grip and hold the solar cell element 10. The gripper 112 can be selected from the group consisting of a mechanical gripper, a pneumatic gripper, an electrostatic gripper, an electrodynamic gripper, a vacuum gripper, and any combination thereof. In some implementations, the gripper 112 can include one or more gripper elements. For example, the gripper 112 can include two or more, such as three, four, five or six gripper elements configured for contacting and gripping the solar cell element 10. For example, the one or more gripper elements can be suction cups configured to provide an under-pressure at a surface of the solar cell element 10 to hold the solar cell element 10 at the one or more gripper elements. The mechanical gripper can use mechanical devices, such as clamps, to hold the solar cell element 10 at the gripper 112. The electrostatic grippers and electrodynamic grippers can use an electrostatic force and an electrodynamic force, respectively, to hold the solar cell element 10 at the gripper 112.

The transfer device 110 can be configured to pick up the solar cell element 10 at, or from, the carrying device 140 to move the solar cell element 10 from the first position to the second position. Further, the transfer device may transfer one solar cell element at a time. As an example, the controller 130 can control a movement of the transfer device 110 to move the solar cell element 10 to assemble, for example, a solar cell arrangement on the support device 150.

In some implementations, the transfer device 110, and particularly the gripper 112, is movable in at least one of a first direction 1 and a second direction 2. The first direction 1 can be a substantially horizontal direction. The second direction 2 can be a substantially vertical direction. The transfer device 110 can be movable sequentially or simultaneously in at least one of the first direction 1 and the second direction 2. Through the movement in the first direction 1 and the second direction 2, the solar cell element 10 held by the transfer device 110 can be moved to the support device 150, for example, to assemble a solar cell arrangement on the support device 150.

For example, the transfer device 110 can move in the second direction 2, for example, upwards, to pick up the solar cell element 10 at, or from, the carrying device 140. The transfer device 110 can then move in the first direction 1, for example, forwards, to move the solar cell element 10 from the carrying device 140 to the support device 150. The transfer device 110 can move in the second direction 2, for example, downwards, to place the solar cell element 10 on the support device 150, e.g., on a support surface 152 of the support device 150. The transfer device 110 can then move in the second direction 2 and the first direction 1, for example, back to the carrying device 140 to pick up another solar cell element from the carrying device 140. It is to be understood that the movement in the first direction 1 can be a movement in a forward direction and a backward direction. Likewise, the movement in the second direction 2 can be a movement in an upward direction and a movement in a downward direction.

The term "vertical direction" is understood to distinguish over "horizontal direction". That is, the "vertical direction" relates to a substantially vertical movement, wherein a deviation of a few degrees, e.g. up to 5° or even up to 10°, from an exact vertical direction is still considered as a "substantially vertical direction". The vertical direction can be substantially parallel to the force of gravity.

The transfer device 110, and particularly the gripper 112, can be configured to be movable for adjusting the orientation of the transfer device 110. In particular, the transfer device 110 can be movable to adjust an orientation of the solar cell element 10 in relation to the transfer device 110. More particularly, the transfer device 110 can be movable to change an orientation of the transfer device 110, and particularly of the gripper 112, before the solar cell element 10 is picked up at the carrying device 140. For example, the transfer device 110 and particularly the gripper 112, can be movable within the plane of the gripping and holding area of the gripper. The gripper may be rotatable within the plane.

According to some embodiments, which can be combined with other embodiments described herein, the controller 130 is configured to adjust an orientation of the transfer device 110 based on the information about the first position of the solar cell element 10 on the carrying device 140 before picking up the solar cell element 10 from the carrying device 140. For example, the transfer device 110, and particularly the gripper 112 of the transfer device 110, can move into an orientation aligned with respect to the information about the first position of the solar cell element 10. The transfer device 110 can be aligned with respect to the solar cell element 10 to provide for an improved gripping action. Bad or failing gripping actions, for example, due to one or more gripping devices, such as suction cups, of the transfer device 110 being outside the surface of the solar cell element 10 which is to be contacted for gripping the solar cell element 10, can be prevented. The determining of the information about the first position can particularly be beneficial when the solar cell elements 10 are lightweight solar cell elements and are likely to move on the carrying device 140, for example, while being transported by the carrying device 140 towards the first position.

The pre-alignment of the transfer device and/or the solar cell element includes several advantages over known procedures. Normally, two measurements have to be done which protracts the alignment process. The present disclosure allows for the detection of the information about the first position of the solar cell element while the transfer device is still moving, and thus is more time efficient. The on-the-fly-detection of the information about the intermediate position further expedites the correct adjustment of the solar cell element. Further, the pre-alignment of the orientation of the transfer device allows for earlier detection of irregularities with respect to the solar cell elements.

According to some embodiments, which can be combined with other embodiments described herein, the controller 130 is configured to adjust an orientation of the transfer device 110 based on the information about the first position and the information about the intermediate position of the solar cell element 10. In one example, the controller 130 is configured to adjust an orientation of the transfer device 110, and particularly of the gripper 112, based on the information about the first position of the solar cell element 10 before picking up the solar cell element 10 from the carrying device 140 as described above. The controller 130 can further be configured to adjust an orientation of the solar cell element 10 in relation to the transfer device 110, for example, by a movement of the transfer device 110 or the gripper 112, based on the information about the intermediate position of the solar cell element 10 before the solar cell element 10 is placed on the support device 150.

For instance, the information about the first position of the solar cell element 10 on the carrying device 140 is detected, the gripper 112 is (pre)-aligned with respect to the solar cell element 10 based on the information about the first position, the solar cell element 10 is then picked up from the carrying device 140, the information about the intermediate position of the solar cell element 10 in relation to the gripper 112 is detected, and the solar cell element is (fine)-aligned based on the information about the intermediate position.

In embodiments, the controller 130 is configured to adjust an orientation of the solar cell element 10 in relation to the transfer device 110, for example, by a movement of the transfer device 110 or the gripper 112, based on (e.g., a combination of) the information about the first position and the information about the intermediate position of the solar cell element 10 before the solar cell element 10 is placed on the support device 150.

For instance, the information about the first position of the solar cell element 10 on the carrying device 140 is detected, the solar cell element 10 is picked up from the carrying device 140, and the information about the intermediate position of the solar cell element 10 in relation to the gripper 112 is detected. The solar cell element 10 can be aligned based on the information about the first position and the information about the intermediate position while the solar cell element 10 is held by the gripper 112. For example, the gripper 112 can roughly be aligned in relation to the solar cell situated on the carrying device using the information about the first position. The information about the intermediate position of the solar cell device in relation to the gripper can then be detected, and a fine-alignment of the solar cell element 10 held by the gripper 112 can be conducted based on the information about the intermediate position.

In some implementations, the transfer device 110, and particularly the gripper 112, is movable in a plane, such as a substantially horizontal plane. Such a movement can also be referred to as "Θ movement". For example, the transfer device 110 can be configured to adjust or align an angular orientation of the solar cell element 10 held by the transfer device 110 in the plane. The angular orientation of the solar cell element 10 can be aligned, for example, with respect to the support device 150 and/or another solar cell element on the support device 150 with which the solar cell element 10 held by the transfer device 110 is to be overlapped to form a solar cell arrangement as described with respect to FIG. 2. The solar cell arrangement can be accurately assembled, and a quality of the solar cell arrangement can be improved.

According to some embodiments, the transfer device 110 can be configured to rotate the solar cell element 10 around a substantially vertical rotational axis by about 180°. For example, edge pieces of pseudo-square solar cells having rounded edges can be brought into similar or substantially identical orientations. For example, one edge piece (e.g., the front or leading edge piece) of the pseudo-square solar cell is not rotated by about 180° and the other edge piece (e.g., the back or trailing edge piece) of the pseudo-square solar cell is rotated by about 180° such that the geometric shapes of the edge pieces are equally oriented or aligned. The second orientation of the solar cell element 10 can be determined after the solar cell element 10 has been rotated around the substantially vertical rotational axis.

According to some embodiments, the transfer device 110, and particularly the gripper 112, is tiltable, for example, with respect to the first direction 1 and/or a horizontal plane. For example, the transfer device 110 can tilt the solar cell element 10 held by the transfer device 110 to align an orientation of the solar cell element 10 with respect to another solar cell element on the support device 150 with which the solar cell element 10 held by the transfer device 110 is to be overlapped. In particular, the backside or backside plane of the solar cell element 10 held by the transfer device 110 can be oriented to be substantially parallel to a frontside or frontside plane of the other solar cell element on the support device 150. In some implementations, the transfer device 110 is configured to align a backside contact of the solar cell element 10 with respect to a frontside contact, such as a busbar, of another solar cell element on the support device 150 such that an electrical contact between the backside contact and the frontside contact can be established, for example, with an adhesive provided therebetween.

For example, the second detection device 126 can include one or more viewing elements, such as one or more cameras, configured to detect the solar cell element 10 on the carrying device 140 and the solar cell element 10 in relation to the transfer device 110. As an example, one viewing element of the second detection device 126 is configured for detecting the information about the intermediate position. In other examples, a first viewing element of the second detection device 126 (e.g., a first camera) is configured for detecting the solar cell element on the carrying device and a second viewing element of the second detection device 126 (e.g., a second camera) is configured for detecting the information about the intermediate position of the solar cell element 10 in relation to the transfer device.

In some implementations, the one or more viewing elements have a field of view 122. The one or more viewing elements can be positioned such that the solar cell element 10 is within the field of view 122 of the one or more viewing elements. As an example, one viewing element of the second detection device 126 can have a field of view extending sufficiently for detecting the information about the intermediate position.

According to some embodiments, which can be combined with other embodiments described herein, the second detection device 126 is configured to detect at least one edge or corner of the solar cell element 10 to detect the information about the intermediate position. For example, the second detection device 126 can be configured to detect the at least one edge or corner to determine at least a part of a contour or silhouette of the solar cell element 10 to determine the information about the intermediate position. Additionally or alternatively, the second detection device 126 is configured to detect printing features on the solar cell element 10 to determine the information about the intermediate position. The printing features can be, for example, fingers, busbars and/or fiducials.

In some implementations, the second detection device 126 includes at least one of one or more cameras and one or more light source devices. Embodiments of such detection devices are described with respect to FIGS. 5A to 5C. The one or more light source devices can be configured to illuminate the solar cell element 10 with regard to the information about the intermediate position. The one or more light source devices can also be referred to as "illuminator". The illumination can increase a contrast. The at least one edge can be detected more accurately, e.g., for determining at least a part of a contour or silhouette of the solar cell element 10.

According to some embodiments, which can be combined with other embodiments described herein, the carrying device 140 can include, or be, a belt conveyor having a roller 144 rotatable around a rotational axis 146 and one or more belts 142 (also referred to as "pickup belt") provided on the roller 144. In some implementations, the carrying device 140 can have two or more belts arranged in parallel and with gaps provided between the two or more belts, as it is shown in the top view of FIG. 1B.

According to some embodiments, which can be combined with other embodiments described herein, one or more cameras of the second detection device 126 are arranged below the carrying device 140 and/or the transfer device 110 is arranged above the carrying device 140. For example, at least part of the second detection device 126, and specifically the one or more detection elements such as the one or more cameras, can be arranged below the carrying device 140. The gap(s) provided between the two or more belts of the carrying device 140 can allow for that the solar cell element 10 can be detected by the second detection device 126 through the gap(s). In some implementations, the transfer device 110 can be provided above the carrying device 140 and/or the second detection device 126, particularly the one or more detection elements, can be provided below the carrying device 140. In other words, the carrying device 140 can be arranged at a position between the transfer device 110 and the second detection device 126.

According to some embodiments, which can be combined with other embodiments described herein, the second detection device 126 is arranged at or on the transfer device 110. For example, the second detection device may be arranged within the gripper 112.

According to some embodiments, which can be combined with other embodiments described herein, the second detection device 126 may be arranged below the gripper, a light source may be arranged at or on the transfer device 110. Exemplarily, the light source may be arranged within the gripper 112. The solar cell elements may be present between the gripper and the second detection device, in particular between the light source and the second detection device.

According to one embodiment, the apparatus 100 may include a first detection device 120, a transfer device positioned downstream from the first detection device 120, a second detection device 126 positioned downstream from the first detection device, a first data connection between the first detection device and the transfer device, and a second data connection between the second detection device and the transfer device. The transfer device is typically configured for adjusting the orientation of the transfer device based on the information about the first position.

The first detection device may detect an information about the first position of the solar cell element. The second detection device may detect an information about the intermediate position of the solar cell element. The data connection between the first detection device and the transfer device may transmit information about the first position of the solar cell element. The second data connection between the second detection device and the transfer device may transmit the information about the intermediate position of the solar cell element.

According to some embodiments, which can be combined with other embodiments described herein, the support device 150 includes, or is, at least one of an electrostatic or electrodynamic chuck and a vacuum chuck. The electrostatic or electrodynamic chuck can use an electrostatic or electrodynamic force, respectively, to hold the solar cell element 10 or solar cell arrangement at the support surface 152. The vacuum chuck can include a support surface 152 configured to support the solar cell element 10 or at least one solar cell arrangement including the solar cell element 10, wherein the support surface 152 can have at least one of holes and recesses connected to a suction device, such as a vacuum pump, in order to generate an under-pressure in the holes and/or recesses to hold the solar cell element 10 or solar cell arrangement at the support surface 152.

According to some embodiments, the support device 150 can include, or be, a belt conveyor. The support device 150, e.g., the belt conveyor, is configured to support, fix and transport the solar cell element 10 or the solar cell arrangement including the solar cell element 10. In particular, the support device 150 can be configured for transportation of the solar cell element 10 or the solar cell arrangement including the solar cell element 10 in a transport direction 4, which can be a substantially horizontal direction.

The belt conveyor constituting the support device 150 can include a roller 154 rotatable around a rotational axis 156 and one or more belts 152 provided on the roller 154. In some implementations, the support device 150 can have two or more belts arranged in parallel and with gaps provided between the two or more belts. For example, each belt of the two or more belts can be configured to support one solar cell arrangement of at least two solar cell arrangements. In other implementations, the support device 140 has one single belt on which the at least two solar cell arrangements, such as three solar cell arrangements, can be assembled in parallel.

According to some embodiments, which can be combined with other embodiments described herein, the carrying device and the support device can be spaced apart from each other. In particular, the transfer device can be configured to move the solar cell element over a predetermined distance from the carrying device to the support device.

According to some embodiments, which can be combined with other embodiments described herein, the carrying device 140 and the support device 150 can overlap with each other by a distance D, for example, in the horizontal direction, without a contact between the carrying device 140 and the support device 150. For example, the belt(s) of the carrying device 140 and the belt(s) of the support device 150 can overlap while not contacting each other. A distance for transferring the solar cell element from the carrying device 140 to the support device 150 can be minimized. A footprint of the apparatus can be reduced and a throughput of the apparatus can be increased, particularly since the reduced distance which the solar cell element has to be transported allows for an increased number of solar cell elements that can be transported per time.

In some implementations, a movement of the support device 150, and in particular a movement of the one or more belts 152, and a movement of the transfer device 110 can be synchronized with each other, for example, during the assembly of the solar cell arrangement on the support device 150. Additionally or alternatively, a movement of the carrying device 140, for example, the one or more belts 142, and a movement of the transfer device 110 and/or the one or more belts 152 of the support device 150 can be synchronized with each other. By synchronizing at least some of the movements, a continuous process flow for assembly of the solar cell arrangement can be provided.

The transfer device 110 is configured for moving or transferring the solar cell element 10 from the carrying device 140, i.e., the first position, to the support device 150, i.e., the second position. For example, the transfer device 110 can sequentially grip or pick up the solar cell element 10 at the carrying device 140, move the solar cell element 10 to the support device 150, align the solar cell element 10, for example, during the movement to the support device 150, and release the solar cell element 10 at the support device 150 in a predetermined position. In particular, the transfer device 110 can be configured to arrange a plurality of solar cell elements including the solar cell element 10 in an overlapping manner to form a solar cell arrangement, such as a shingled solar cell.

According to an aspect of the present disclosure, a system for use in the manufacture of a solar cell arrangement, such as a shingled solar cell, is provided. The system includes the apparatus 100 for aligning a solar cell element according to the embodiments described herein, an adhesive applying device, and a separation device including a laser scribing unit for preparing a solar cell to provide at least one solar cell element.

In some implementations, at least one of the carrying device 140 and the support device 150 are selected from the group consisting of a conveyor belt, a vacuum chuck, an electrostatic chuck, an electrodynamic chuck, and any combination thereof. The separation device may be configured to provide solar cell elements with a predetermined width.

The first position can be provided when the solar cell element 10 rests on the carrying device 140, for example, on the one or more belts 142. In particular, in some embodiments, the solar cell element 10 does not move with respect to the carrying device 140 in the first position. The second position can be provided when the solar cell element 10 rests on the support device 150. In particular, in some embodiments, the solar cell element 10 does not move with respect to the support device 150 in the second position. Yet, this does not exclude any movement of the carrying device 140, for example, the one or more belts 142, and the support device 150 when the solar cell element 10 is positioned thereon.

Figure 2:
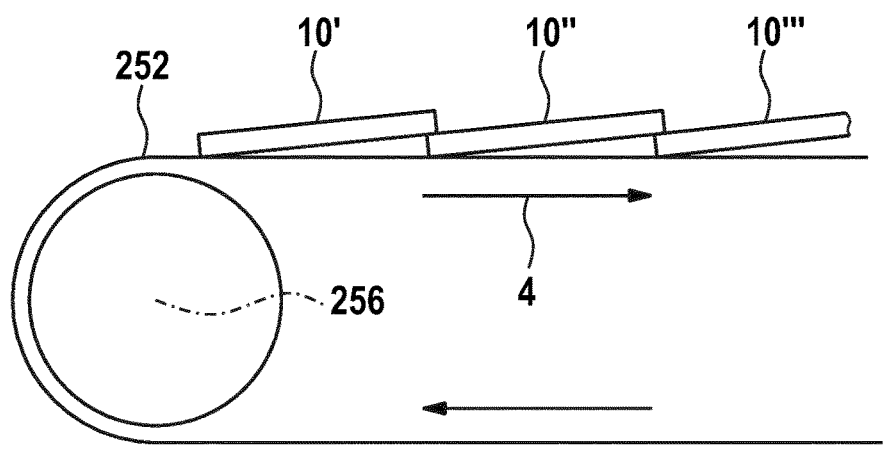
FIG. 2 shows a schematic view of overlapping solar cell elements on a support device according to embodiments described herein.

FIG. 2 shows a schematic view of overlapping solar cell elements 10', 10", 10''' on a support device 150 according to embodiments described herein.

The apparatuses, systems and methods of the present disclosure can be configured to manufacture or assemble solar cell arrangements on the support device 150. The support device may be e.g. a conveyor belt 252 with a rotation axis 256. The solar cell arrangements of the present disclosure can be shingled solar cells, which can also be referred to as "hypercells" or "supercells". The solar cell arrangements can be used in solar cell modules. The solar cell arrangements can be made of a plurality of partially overlapping solar cell elements 10', 10", 10''' (also referred to as "solar cell pieces"). Adjacent solar cell elements are electrically connected to each other in the overlapping region. The solar cell elements are connected in series such that current generated by the individual solar cell elements flows along the series of solar cell elements to be collected, for example, at an end portion of the solar cell arrangement. The overlapping configuration can provide high-efficiency solar cell arrangements. In particular, the solar cell arrangements allow for increasing a module power by increasing a used or active area. Typically, the overlapping configuration can increase the module power by, for example, 20 to 40 Watts. The used or active area can correspond to an area that is irradiated by solar light and that participates in the generation of power. For example, the used or active area can correspond to an area of the solar cells that is not covered by, for example, conductive line patterns, such as fingers and/or busbars.

In some implementations, an adhesive, such as an electrically conductive adhesive, can be provided to connect two solar cell elements in the overlapping region. Two solar cell elements can be overlapped with the adhesive being provided at one solar cell element of the two solar cell elements such that the two solar cell elements can be electrically and mechanically connected to each other. According to some embodiments, the adhesive is an electrically conductive adhesive selected from the group consisting of solder, silver paste, and an electrically conductive silicone adhesive.

Figure 3:
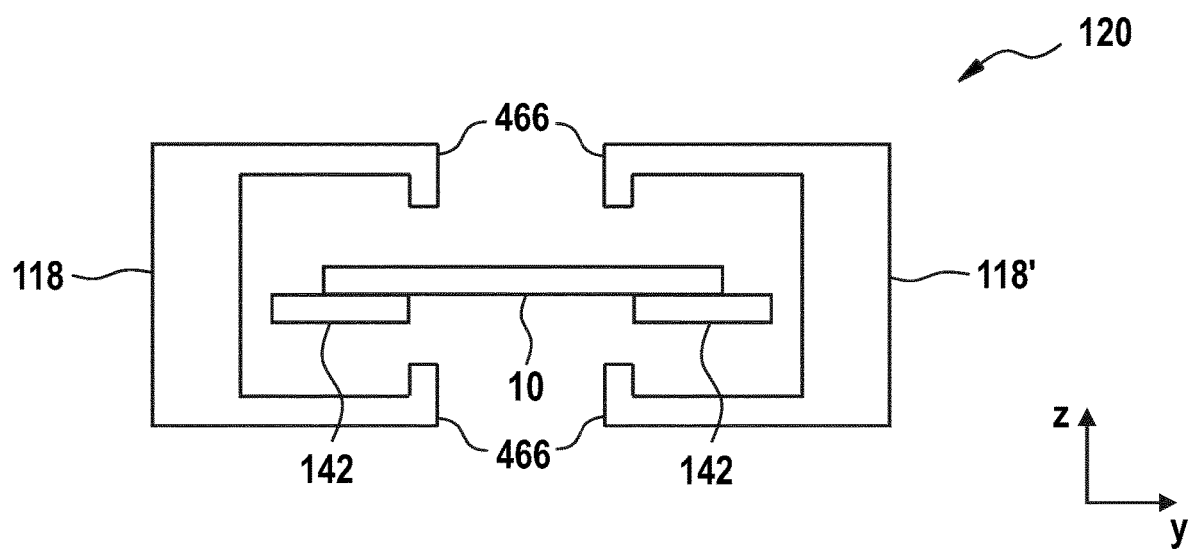
FIG. 3 shows a cross-sectional view of a first detection device according to embodiments described herein.

FIG. 3 shows a cross-sectional view of a first detection device 120 according to embodiments described herein. The first detection device may include a first and a second detection section 118, 118'. The detection device 120 may thus include two detection sections 118, 118'. The detection sections can be sensors. The detection sections 118, 118' may include action spots 466. For example, the detection sections are configured as optical barriers. The optical barrier, for example, may be established between the two action spots of one detection section. The detection sections 118, 118' of the detection device 120 may be arranged at the sides of the carrying device 140, respectively. The carrying device 140 may include two conveyor belts 142 spaced apart from each other. For example, the action spot is above and/or below the carrier device 140, in particular the action spot may be above and/or below the solar cell element 10.

The detection sections 118, 118' can each include two action spots 466. The two action spots can be arranged so that one is above and the other is below the solar cell element. For example, the detection sections 118, 118' can be chosen from the list of a photoelectric sensor, a laser sensor and/or a fiber optic sensor. The first detection device may perform the detection simultaneously at the first and the second detection section 118, 118'.

According to one embodiment, an optical barrier with a light axis 462 is established between the two action spots 466. In other words, to establish one optical barrier, two action spots may be present. When the carrying device moves the solar cell element, the solar cell element may pass the detection device. Thus, the solar cell element may pass the action spots. Since two detection sections 118, 118' may be present, four action spots may be passed. According to an embodiment, the optical barrier can be crossed by the solar cell element. In other words, the light axis is disrupted by the solar cell element. Crossing the detection device 120 by the solar cell element triggers a signal. For example, the signal can be a yes signal or a no signal.

A "yes signal" as used herein, is to be understood as a signal that is detected when a solar cell element crosses the first detection device. The "yes signal" can be understood as a signal that confirms the presence of a solar cell element. The "yes signal" may be detected at both detection sections of the detection device. The "yes signal" may occur at two different points in time, depending on the orientation of the solar cell element on the carrying device. The detection time points of the "yes signals" at each of the detection sections may be compared to each other and set into relation to the velocity v of the carrying device.

A "no signal" as used herein, is to be understood as a signal that may be detected when no solar element crosses the first detection device. The "no signal" can be understood as a signal that confirms the absence of a solar cell element.

The carrying device may transport more than one solar cell element at any same time. For example, a batch or sequence of solar cell elements is transported at the same time. Additionally or alternatively, a sequence of information about the first position of multiple solar cell elements may be detected by the first detection device 120. The detection device 120 can detect several solar cell elements in a row i.e. detect a sequence or batch of solar cell elements.

For example, one sequence includes at least two solar cell elements, particularly more than two solar cell elements, more particularly four solar cell elements or more.

The solar cell element 10 is transported across the first detection device 120 by the carrying device 140. The carrying device may be operated at a constant velocity v. According to one embodiment, the detection device 120 can detect the solar cell element simultaneously at the detection sections. For example, the detection sections 118, 118' may detect the solar cell element at the same point in time. The velocity of the transfer device 110 may be synchronized with the velocity of the carrying device.

The first detection device 120 may detect the solar cell element 10 during movement of the transfer device, i.e. when the transfer device transfers a previous solar cell element 10' towards the support device. Additionally or alternatively, the first detection device may detect the solar cell element when the transfer device moves towards the carrying device to e.g. grab the solar cell device for transference to the support device. The on-fly-configuration includes the advantage of using simple sensors as the first detection device.

Figure 6:
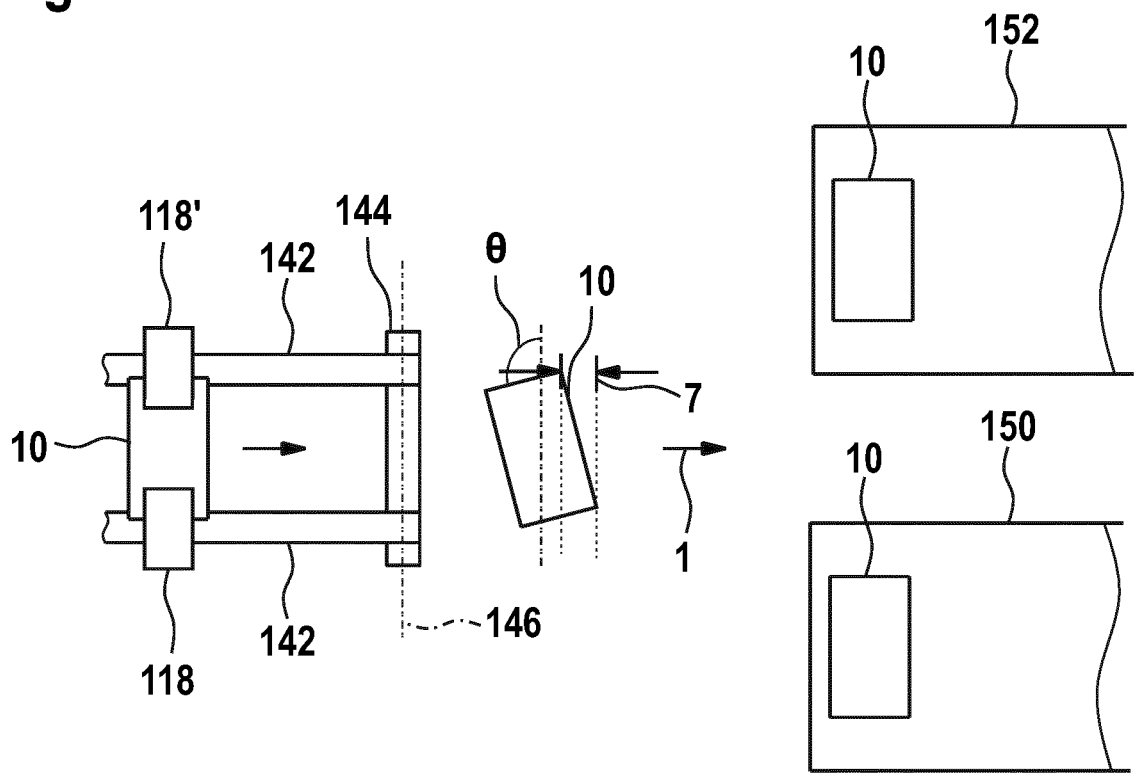
FIG. 6 shows a schematic top view of an apparatus for transferring a solar cell element according to further embodiments described herein.

According to embodiments, different scenarios are possible depending on the yes or no signal detection of the detection sections 118, 118' which are described with regard to FIG. 6.

With respect to FIG. 4A and according to an embodiment, the first detection device 120 may include two detection sections 118, 118'. The two detection sections may each include a light source 460. The detection sections may each include at least one action spot 466. In particular, the detection sections may each include two action spots 466. According to an embodiment, the first detection device is a photoelectric sensor or a laser sensor. The photoelectric sensor may be of an optical barrier type. The photoelectric sensor of an optical barrier type may detect a disruption of a light axis 462 between the two action spots 466. For example, the first of the two action spots is the light source 460 and the second of the two action spots is the receiver 464. For example, a solar cell element 10 passing the first detection device 120 disrupts the light axis 462. A yes-signal may be generated. The yes signal may be generated as long as the solar cell element disrupts the light axis. When the solar cell element passed the first detection device completely, a no signal may be generated until the next solar cell element disrupts the light axis. The sensor can further be a fiber optic sensor. Fiber optic sensors have the advantage of allowing for the use of small detection devices.

With respect to FIG. 4B and FIG. 4C and according to an embodiment, the detection section 118', 118" may only include one action spot. For example, the detection sections can be a reflection type sensor. The one action spot includes the light source 460 and the receiver 464. The solar cell element passing the detection device may reflect the light emitted from the light source. The receiver then detects the reflected light. Further, the detection device 120 can be a retroreflecting type sensor. The photoelectric sensor, the laser sensors and the fiber optical sensors each can be used as optical barrier type sensors or refection sensors.

The sensor choice may be dependent from the carrying device. According to an embodiment, the sensor can be a reflection sensor when a closed carrying device is used i.e. when a continuous carrying device is used.

Figure 5A:
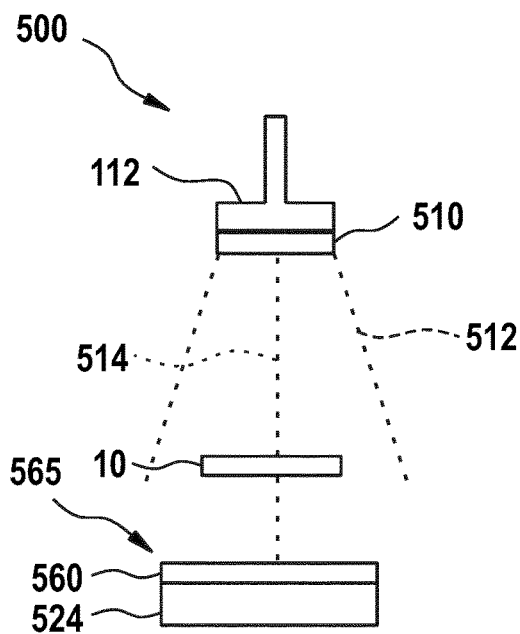
FIGS. 5A, B and C show schematic views of a second detection device according to embodiments described herein.

FIG. 5A shows a schematic view of a second detection device 500 according to embodiments described herein.

According to some embodiments, which can be combined with other embodiments described herein, one or more cameras 510 of the second detection device are arranged at or on the transfer device. For example, the one or more cameras 510 of the second detection device can be positioned (e.g., horizontally) within the gripper 112 of the transfer device. A field of view is provided from top to bottom. The one or more light source devices 565 can include one or more light sources arranged in direct line of sight 514 to the one or more cameras 510. The camera may be attached to the gripper 112 and may follow the movements of the gripper.

Figure 5B:
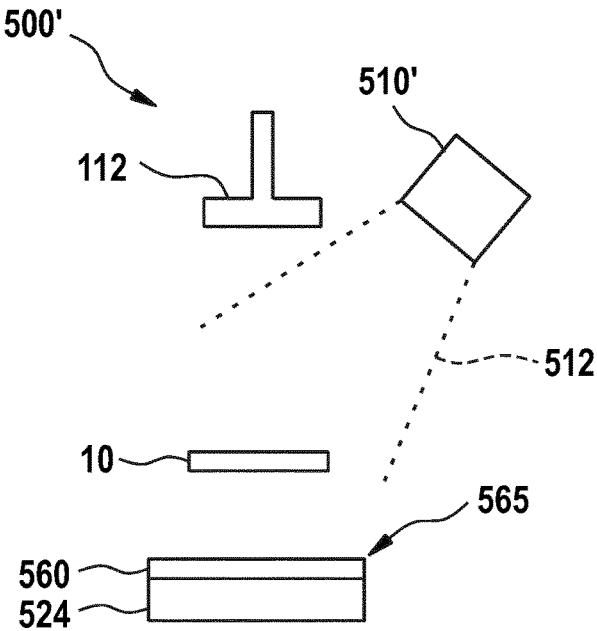

FIG. 5B shows a schematic view of a second detection device 500' according to embodiments described herein.

According to some embodiments, which can be combined with other embodiments described herein, the second detection device 500' includes one or more light source devices 565 and one or more cameras 510'. The one or more light source devices 565 can provide for an illumination system that can improve an image quality of the images taken by the one or more cameras 510'. The one or more light source devices 565 can include one or more light sources 560 arranged in the direct line of sight of the one or more cameras 510.

For example, the one or more cameras 510' can have a field of view 512 in which the one or more light source devices 565 are positioned. For detecting the second orientation of the solar cell element 10, the solar cell element 10 can be provided at a position within the field of view 512 between the one or more light source devices 565 and the one or more cameras 510'. In particular, the solar cell element 10 can be provided at a position in the direct line of sight. The arrangement using the direct line of sight for detecting the first orientation and/or the second orientation of the solar cell element 10 can improve a contrast such that an edge or contour of the solar cell element 10 can be determined more precisely.

The one or more light sources are selected from the group consisting of lamps, light tapes, flash lights, and any combination thereof. For example, the one or more light sources 560 can be light tapes fixed to a support 524, such as a plastic support. The light tapes are beneficial in that the light tapes provide an extended illumination area which can be larger than a surface area of the solar cell element 10. In other words, when seen from the camera's perspective, the light tape(s) can protrude over at least one edge of the solar cell element 10. The one or more cameras 510' can "see" the parts of the light tapes that are not covered by the solar cell element 10. An improved contrast can be provided, and an edge or contour of the solar cell element 10 can be detected in an accurate manner.

Figure 5C:
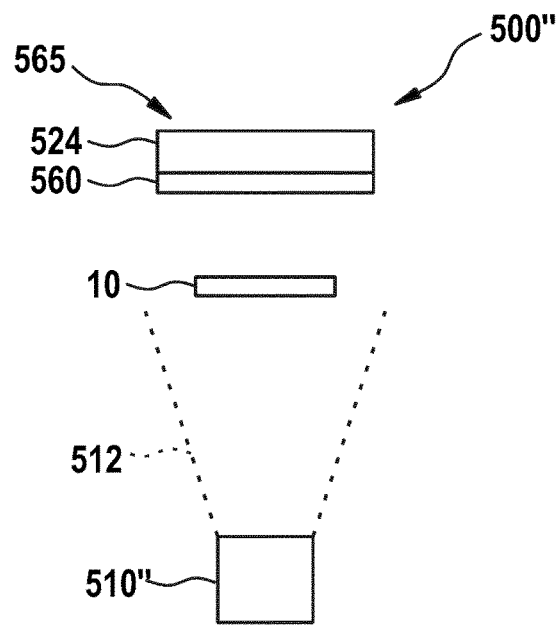

FIG. 5C shows a schematic view of a detection device 500" according to further embodiments described herein.

According to some embodiments, which can be combined with other embodiments described herein, one or more cameras 510" of the second detection device are arranged laterally with respect to at least one of the carrying device and the transfer device. For example, the one or more cameras 510" of the second detection device can be positioned (e.g., horizontally) adjacent to the gripper 112 of the transfer device.

According to some embodiments, the one or more light sources 560 are selected from the group consisting of lamps, light tapes, flash lights, light bars (also referred to as "illuminator bars") and any combination thereof. In some implementations, the one or more light sources 560 can be flash lights configured to emit flashes. For example, the one or more light sources 560 can be configured to emit at least one flash for determining an orientation of the solar cell element 10. In particular, the one or more light sources 560 can be configured to emit at least one first flash for determining the first orientation of the solar cell element 10 on the carrying device. The one or more light sources 560 can be configured to emit at least one second flash for determining the second orientation of the solar cell element 10 held by the transfer device. Such a "double flash" process can be used to align the solar cell element 10 that is to be put on the support device.

FIG. 6 shows a schematic top view of an apparatus for transferring a solar cell element according to further embodiments described herein.

As can be seen in FIG. 6, one detection section 118 may be at one side of the carrying device and a second detection section 118' may be at another side of the carrying device.

According to a first scenario, one of the detection sections detects the presence of a solar cell element 10 while the second detection section detects the absence of the solar cell element to a specific point in time. For example, the detection section at one side of the carrying device detects the presence of a solar cell element. The detection section at another side of the carrying device may detect the absence of the solar cell element. Additionally, the detection section at the one side of the carrying device may detect the presence of the solar cell element for a specific time range x whereas the detection section at the other side of the carrying device may detect the absence of the solar cell element for a specific time range y and then detects the presence of the solar cell element. In other words, the detection section at the one side of the carrying device may detect a yes signal over a time range x and the detection section at the other side of the carrying device detects a no signal over a specific time range y. The time range x may depend on the velocity of the carrying device and/or on the width of the detected solar cell element. The time range x may be e.g. shorter than 2 ms. The time range y may depend on the degree of rotation of the detected solar cell element. Via the time range y, in which the detection section at the other side of the carrying device may detect the absence of the solar cell element, and/or the difference between the time ranges x and y, the distance 7 is determinable.

According to a second scenario, one of the detection sections detects the presence of a solar cell element while the second detection section detects the absence of the solar cell element to a specific point in time. However, in contrast to the first scenario, the detection section at the other side of the carrying device may detect the presence of the solar cell element first and the detection section at the one side of the carrying device may detect the absence of the solar cell element second. Apart from that, the detection is similar to the one described with respect to the first scenario.

According to a third scenario, the one or the other detection section may detect the solar cell element in the substantially same time range. "Substantial same time range" may be regarded as a time difference (which is dependent on the carrying device velocity and thus on the velocity of the solar cell element) that relates to a maximal rotation of the solar cell element of 1 degree in a $\Theta$ (theta)-direction is still considered as being within the same time range. In other words, when the time range x and/or the time range y as described above are similar at both detection sections, the solar cell element is in a correct position on the carrying device, e.g. in a vertical position.

The time ranges x and y can be compared to each other which results in a detection time difference and/or distance 7. The detection time difference and/or the distance 7 is an indicator for the degree of rotation of the orientation of the solar cell element in a plane parallel to the plane of the solar cell element. The time difference and/or the distance 7 may be used to calculate the rotation in a $\Theta$ (theta)-direction. For example, the middle axis of the solar cell element and/or the center of the solar cell element on the middle axis may be used to calculate the degree of rotation in a $\Theta$ (theta)-direction.

As used herein the term "$\Theta$ (theta)-direction" is to be understood as a rotational direction in a substantially horizontal plane around the center of a solar cell element. For example, the solar cell element is placed vertically on a carrying device. The vertical position on the carrying device of the solar cell element ±1 degrees in a $\Theta$-direction, in particular ±0.5 degrees in a $\Theta$-direction, more particular ±0.1 degrees in a $\Theta$-direction may be regarded as the correct position of the solar cell element for alignment. A deviation of >1 degrees from the correct vertical position in a $\Theta$-direction may be be compensated by adjusting the transfer device. In other words, the apparatus allows for a maximal rotation deviation in a $\Theta$-direction of the solar cell element of 1 degree, particularly 0.5 degrees, more particularly 0.1 degrees.

The yes or no signal as well as the detection time and/or the distance 7 may be included in the information about the first position. As used herein, information about a first position may include data including the detection time ranges x and/or y (the presence and absence time ranges), the calculated distance 7, the velocity v of the carrying device and/or the predetermined width of the solar cell element. Information about an intermediate position as used herein, includes all information that is detected by the second detection device.

According to some embodiments, which can be combined with other embodiments described herein, the information about the first position is detected by the first detection device. A data connection between the first detection device and the transfer device may be used to pass the obtained information about the position to the transfer device. For example, the controller 130 may process the data obtained from the information about the position to adjust the transfer device. According to some embodiments, the information about the intermediate position is detected by the second detection device. A data connection between the second detection device and the transfer device may be used to pass the obtained information about the position to the transfer device. For example, the controller 130 may process the data obtained from the information about the position to adjust the transfer device.

According to an embodiment, the orientation of the transfer device 110 may be adjusted based on the information about the first and the intermediate position of the solar cell element. The solar cell element may then be moved in a direction 1 from the carrying device to the support device.

According to a further embodiment, the transfer device 110 may include more than one transfer device. For example, the transfer device may include more than one gripper 112, e.g. two grippers. For example, the two grippers may act alternately on the solar cell elements on the carrying device. For example, the two grippers transfer one solar cell element each from the first position on the carrying device to the second position on the support device.

According to a further embodiment that can be combined with any other embodiment described herein, the support device may include more than one support device. For example, the support device may include two conveyor belts 150, 152, more particularly four conveyor belts even more particularly more than four conveyor.

Figure 7:
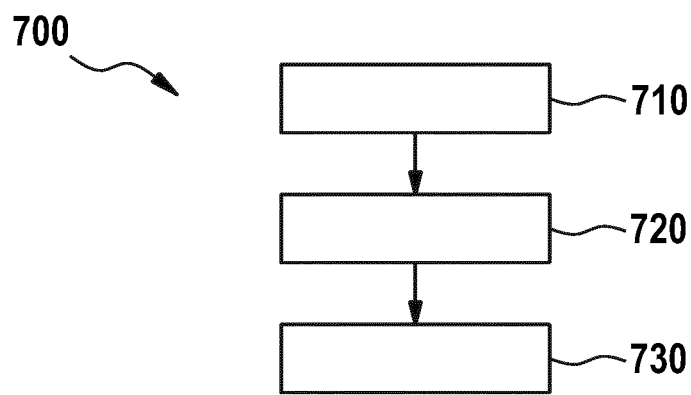
FIG. 7 shows a flow chart of a method for aligning a solar cell element according to embodiments described herein.

FIG. 7 shows a flow chart of a method 700 for aligning a solar cell element according to embodiments described herein. The method 700 can utilize the apparatuses and systems according to the embodiments described herein. Likewise, the apparatuses and systems can utilize the method 700.

The method 700 includes in block 710 detecting information about a first position of the solar cell element positioned on a carrying device, in block 720 adjusting an orientation of the transfer device based on the information about the first position, and in block 730 detecting information about an intermediate position of the solar cell element in relation to a transfer device.

The method 700 can further move the solar cell element in at least one of an x-, y-, z-, and theta (θ)-direction. For example, the x- and y-direction can define the horizontal plane. The z-direction can be a vertical direction. The movement in the theta-direction can correspond to a movement of the solar cell element and the horizontal plane. Such a movement can also be referred to as a "Θ movement".

According to some embodiments, the method 700 further includes placing the solar cell element on a support device and aligning the solar cell element to another solar cell element.

According to further embodiments, the method 700 includes adjusting an orientation of the transfer device based on the information about the first position of the solar cell element before picking up the solar cell element using the transfer device from the carrying device for moving the solar cell element away from the carrying device. In particular, the transfer device, such as the gripper thereof, can be aligned with respect to the solar cell element to allow for an improved pickup action. For example, the gripper can be aligned with respect to a surface of the solar cell element that is to be contacted by the gripper.

According to some embodiments, which can be combined with other embodiments described herein, adjusting the orientation of the solar cell element includes adjusting the orientation of the solar cell element based on the information about the intermediate position. In particular, the transfer device, and particularly the gripper, is movable in the theta-direction for moving the solar cell element in the theta-direction.

According to some embodiments, the method may include the first detection device detecting the information about the first position of the solar cell element during movement of the carrying device and/or the transfer device.

According to embodiments described herein, the method for aligning a solar cell element can be conducted using computer programs, software, computer software products and the interrelated controllers, which can have a CPU, a memory, a user interface, and input and output devices being in communication with the corresponding components of the apparatus for processing a large area substrate.

The present disclosure uses a double-detection of an orientation of a solar cell element to align the solar cell element, for example, in a process of assembling a solar cell arrangement used in a solar cell module. In particular, the solar cell element is put on a support device, for example, to assemble solar cell arrangements, wherein during the process of transferring the solar cell element to the support device, an orientation of the solar cell element is detected in order to improve the transfer process. Specifically, the solar cell element can be brought into a predetermined orientation before the solar cell element is put on the support device.

While the foregoing is directed to embodiments of the disclosure, other and further embodiments of the disclosure may be devised without departing from the basic scope thereof, and the scope thereof is determined by the claims that follow.

The invention claimed is:

1. Apparatus for aligning a solar cell element, comprising:
   a transfer device configured for moving the solar cell element from a first position on a carrying device to a second position on a support device;
   a first detection device configured to detect information about a first position of the solar cell element on the carrying device; and
   a second detection device configured to detect information about an intermediate position of the solar cell element in relation to the transfer device; wherein
   the transfer device being configured to adjust an orientation of the transfer device based on the information about the first position,
   the first detection device comprises a first and a second detection section placed at different sides of the carrying device, the first and second detection sections are configured as optical barriers, and
   the first detection device is configured to cause the first detection section to detect presence of the solar cell element for a time range x, cause the second detection section to detect absence of the solar cell element for a time range y and then detect presence of the solar cell element, and compare the time range x and the time range y to determine an indicator for a degree of rotation of an orientation of the solar cell element in a plane parallel to a plane of the solar cell element.

2. The apparatus for aligning a solar cell element according to claim 1 wherein:
the transfer device positioned downstream from the first detection device;
the second detection device positioned downstream from the first detection device; and
the apparatus for aligning a solar cell element further comprising:
a first data connection between the first detection device and the transfer device; and
a second data connection between the second detection device and the transfer device.

3. The apparatus for aligning a solar cell element according to claim 1, wherein the transfer device is configured to adjust an orientation of the solar cell element based on the information about the intermediate position.

4. The apparatus for aligning a solar cell element according to claim 1, wherein the first detection device comprises a first and a second detection section.

5. Method for aligning a solar cell element, comprising:
detecting information about a first position of the solar cell element on a carrying device;
adjusting an orientation of a transfer device based on the information about the first position; and
detecting information about an intermediate position of the solar cell element in relation to the transfer device, wherein
the information about the first position is detected by a first detection device,
the first detection device comprises a first and a second detection section placed at different sides of the carrying device, the first and second detection sections are configured as optical barriers, and
the first detection device is configured to cause the first detection section to detect presence of the solar cell element for a time range x, cause the second detection section to detect absence of the solar cell element for a time range y and then detect presence of the solar cell element, and compare the time range x and the time range y to determine an indicator for a degree of rotation of an orientation of the solar cell element in a plane parallel to a plane of the solar cell element.

6. The method for aligning a solar cell element according to claim 5, wherein the transfer device adjusts an orientation of the solar cell element based on the information about the first position and the information about the intermediate position.

7. The method for aligning a solar cell element according to claim 5, wherein a first detection device detects information about the first position of the solar cell element during movement of one device selected from the group consisting of the carrying device or the transfer device.

8. The method for aligning a solar cell element according to claim 5, further including:
placing the solar cell element on a support device; and
aligning the solar cell element to another solar cell element.

9. System for use in the manufacture of an assembled solar cell, comprising:
the apparatus of claim 1;
an adhesive applying device; and
a separation device comprising
a laser scribing unit for preparing a solar cell to provide at least one solar cell element.

10. The method for aligning a solar cell element according to claim 5, wherein detecting information about the first position of the solar cell element is performed simultaneously at a first and a second detection section.

11. The method for aligning a solar cell element according to claim 5, wherein the method further comprises orienting the transfer device comprises by adjusting the orientation of the transfer device to the orientation of the solar cell element.

12. The method for aligning a solar cell element according to claim 5, wherein the method further comprises pre-aligning the transfer device according to the information about the first position.

13. The method for aligning a solar cell element according to claim 12, wherein the method further comprises fine-aligning the transfer device according to the information about the intermediate position.

14. The method for aligning a solar cell element according to claim 13, wherein fine-aligning is takes place during a time period when the solar cell element is transferred by the transfer device towards a support device.

15. The method for aligning a solar cell element according to claim 5, wherein the method further comprises calculating a center of the solar element.

16. The method for aligning a solar cell element according to claim 5, wherein the method further comprises picking up the solar cell element by the transfer device, the transfer device picking up one solar cell element at a time.

17. The method for aligning a solar cell element according to claim 16, wherein the method further comprises moving the transfer device for changing an orientation of the transfer device before picking up the solar cell element.

18. The method for aligning a solar cell element according to claim 5, wherein the method further comprises aligning the solar cell element based on the information about the first position and the information about the intermediate position while the solar cell element is held by the transfer device.

19. The method for aligning a solar cell element according to claim 5, wherein the method further comprises tilting the solar cell element held by the transfer device to align an orientation of the solar cell element with respect to another solar cell element on a support device with which the solar cell element is to be overlapped.

20. The method for aligning a solar cell element according to claim 5, wherein the method further comprises illuminating the solar cell element with one or more light sources arranged at a second detection device for increasing a contrast during detecting the information about the intermediate position.

21. The system of claim 9, wherein at least one of the carrying device and the support device are selected from the group consisting of a conveyor belt, a vacuum chuck, an electrostatic chuck, and any combination thereof.

22. The apparatus for aligning a solar cell element according to claim 1, wherein the transfer device is selected from the group consisting of a mechanical gripper, a pneumatic gripper, an electrostatic gripper, an electrodynamic gripper, a vacuum gripper, and any combination thereof.

* * * * *